United States Patent
Lan et al.

(10) Patent No.: US 7,955,993 B2
(45) Date of Patent: Jun. 7, 2011

(54) OXYGEN PLASMA REDUCTION TO ELIMINATE PRECURSOR OVERFLOW IN BPTEOS FILM DEPOSITION

(75) Inventors: Chin Kun Lan, Hsinchu (TW); Sheng-Wen Chen, Shinjuang (TW); Hung Jui Chang, Shetou Township, Changhua County (TW); Yu-Ku Lin, Tainan (TW); Ying-Lang Wang, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 18 days.

(21) Appl. No.: 12/478,493

(22) Filed: Jun. 4, 2009

(65) Prior Publication Data
US 2010/0311252 A1    Dec. 9, 2010

(51) Int. Cl.
*H01L 21/31* (2006.01)
*H01L 21/469* (2006.01)
(52) U.S. Cl. ............... 438/784; 438/680; 257/E21.159
(58) Field of Classification Search ............... 438/784, 438/680; 257/E21.17, E21.159
See application file for complete search history.

(56) References Cited

U.S. PATENT DOCUMENTS

| | | | | |
|---|---|---|---|---|
| 5,268,333 A | * | 12/1993 | Lee et al. | 438/698 |
| 5,656,556 A | * | 8/1997 | Yang | 438/646 |
| 5,807,792 A | * | 9/1998 | Ilg et al. | 438/758 |
| 5,814,377 A | * | 9/1998 | Robles et al. | 427/579 |
| 5,859,458 A | * | 1/1999 | Hsueh et al. | 257/347 |
| 5,879,574 A | * | 3/1999 | Sivaramakrishnan et al. | 216/60 |
| 6,812,162 B2 | * | 11/2004 | Govindarajan et al. | 438/783 |
| 2003/0019427 A1 | * | 1/2003 | Ghanayem et al. | 118/712 |
| 2004/0058559 A1 | * | 3/2004 | Govindarajan et al. | 438/778 |

* cited by examiner

*Primary Examiner* — Jarrett J Stark
(74) *Attorney, Agent, or Firm* — Tung & Associates

(57) ABSTRACT

A method including providing a semiconductor substrate in a reaction chamber; flowing a first reactant including silicon and oxygen, a boron dopant and a phosphorus dopant into the reaction chamber so that a layer of BPTEOS is deposited on the semiconductor substrate; stopping the flow of the first reactant, boron dopant and phosphorus dopant into the reaction chamber and so that a phosphorus dopant and boron dopant rich film is deposited over the layer of BPTEOS; and reducing the film comprising exposing the film to an $O_2$ plasma.

18 Claims, 2 Drawing Sheets

OXYGEN PLASMA REDUCTION TO ELIMINATE PRECURSOR OVERFLOW IN BPTEOS FILM DEPOSITION

FIELD OF THE INVENTION

The present invention relates to methods of making semiconductor devices, and more particularly to a method including depositing a BPTEOS film.

BACKGROUND OF THE INVENTION

Chemical vapor deposition is the process of depositing a solid film on a semiconductor wafer surface through a chemical reaction of a gas mixture. Typically the semiconductor wafer surface or its vicinity is heated in order to provide additional energy to the system to drive the reactions. Chemical vapor deposition can be accomplished utilizing a range of equipment reactor designs, with each reactor design producing slightly different types of film quality. Chemical vapor deposition reactors are broadly categorized based upon the reaction chamber pressure regime used during the operation: atmospheric-pressure (APCVD) reactors and reduced-pressure reactors. The reduced-pressure chemical vapor deposition reactors have two general types. First, there are low-pressure chemical vapor deposition reactors (LPCVD) where the energy input is thermal. Second, there are plasma-assisted chemical vapor deposition reactors, either plasma enhanced (PECVD) or high-density plasma (HDPCVD), where the energy is partially supplied by plasma as well as thermally.

APCVD generally operates in a mass-transport limited regime. At any given time, there may not be sufficient gas molecules present at the wafer surface for a reaction to occur. Therefore, the reactor must be designed to have optimum reactant gas flow to every wafer in the system. APCVD deposited films often exhibit poor step coverage.

LPCVD systems operate at a medium vacuum of about 0.125 Torr, and employ temperatures between 300° C. and 900° C. Conventional oxidation type furnaces (horizontal or vertical) and multichamber cluster tools can be used for LPCVD processing. LPCVD reactors typically operate in a reaction-rate limited regime. In this reduced-pressure regime, the diffusivity of the reacting gas molecules increases so that the mass-transferring of a gas to the wafer no longer limits the rate of the reaction. Because of this transfer state, the gas flow conditions inside the reactor are not important, permitting the reactor design to be optimized for high wafer capacity (e.g., wafers can be closely spaced). Films are uniformly deposited on a large number of wafer surfaces as long as the temperature is tightly controlled. Step coverage is typically good using a LPCVD process.

Yang et al., U.S. Pat. No. 6,406,640, discloses a plasma etching method wherein a dielectric layer such as TEOS is deposited over a BPTEOS layer. The TEOS layer can act to stabilize the BPTEOS layer during processing and/or prevent etching and/or migration of dopants from the BPTEOS layer into a subsequent deposited layer. The capping layer may be etched in a first stage, under optimum etching conditions which are not necessarily the optimum etching conditions for the underlying BPTEOS layer. After the capping layer has been etched, the underlying BPTEOS layer may be etched by an $O_2$ plasma striking method. The plasma striking method includes the use of $O_2$ plasma strike wherein a high concentration of $O_2$, along with $CHF_3$, $C_2F_6$ and the like are used first, and after the plasma stabilizes, the $O_2$ concentration is reduced to etch the BPTEOS layer.

Hsuch et al, U.S. Pat. No. 6,489,213, discloses a method for manufacturing a semiconductor device including a BPTEOS layer formed from any of a variety of precursors such as TEOS (tetraethylorthosilicate), TMB (trimethylborate), TMP (trimethylphosphite). The BPTEOS layer may be formed by reacting precursors in a CVD reactor at atmospheric pressure (APCVD) or sub-atmospheric pressure (SACVD), both with the addition of oxygen or ozone. The process is called ozone-PBTEOS or $O_3$-PBTEOS. The BPTEOS layer is typically deposited to a thickness of about 2,000 to about 20,000 angstroms and preferably from about 6,000 to about 15,000 angstroms thick, and may include a dopant concentration that is about 0 to about 6 weight percent boron and about 4 to about 8 weight percent phosphorus.

Wang, et al., U.S. Pat. No. 6,294,483, discloses a method of preventing delamination of APCVD BPSG films. BPSG layers are formed over PECVD silicon oxide layers by atmospheric chemical vapor deposition using ozone and TEOS. The method prevents the formation of voids in deep depression such as are found between metallization lines or closely spaced polysilicon structures in flash memory integrated circuits. Boron and phosphorus BPSG precursors may be used including TMP(trimethyl phosphite) and TMB (trimethyl borate) respectively, and other precursors including TMPO (trimethyl phosphate), diborane, or SiOB.

Huange, et al., U.S. Pat. No. 5,736,450, discloses a process for fabricating cylindrical capacitors for use in DRAMs is described wherein this silicon nitride etch stop layer is eliminated. The silicon nitride etch stop layer is replaced by two dielectric layers that have generally similar properties and other respects but substantially different etch rates. For a fast etching dielectric, $O_3$ TEOS is used while, for the slow etching dielectric, BPTEOS is used. The BPTEOS and the $O_3$ TEOS are etched in 10:1 buffered oxide etch solution (91 percent ammonium fluoride (40 percent strength)) and 9 percent hydrofluoric acid (49 percent strength)).

Ngo, et al. U.S. Pat. No. 6,627,973, discloses a method of fabricating a flash memory semiconductor device having a virtually void-free interlayer dielectric, including the steps of: (a) depositing a first boron-phosphorus-tetraethyl-orthosilicate (BPTEOS) layer on a silicon substrate, the first BPTEOS layer being formed from a group of reagents including a boron dopant, a phosphorus dopant and TEOS, and the depositing step (a) including a first boron dopant flow rate, a first phosphorus dopant flow rate and a first TEOS flow rate; (b) depositing a second BPTEOS layer on the first BPTEOS layer, the second BPTEOS layer being formed from a group of reagents including a boron dopant, a phosphorus dopant and TEOS, and the depositing step (b) including a second boron dopant flow rate, a second phosphorus dopant flow rate, and a second TEOS flow rate.

Mori, U.S. Pat. No. 6,624,020, discloses a method of making a metal oxide semiconductor transistor including providing a semiconductor substrate and forming a trench provided through a silicon nitride film, a BPTEOS film and a silicon oxide film grown at low temperatures. A native oxide film on the top surface of the BPTEOS film is etched with BHF. Disclosed also is the use of hydrofluoric acid solution to etch the BPTEOS film.

Liu, U.S. Pat. No. 6,248,624, discloses a method of making a semiconductor device including the deposition of alternating layers of doped oxide and non-doped oxide on semiconductor substrates including using TEOS reactant gases that can be doped with boron and phosphorus such that an in-situ doped BPTEOS is used to deposit borophosphosilicate glass films. TEOS reactant gases that are not doped can be used to deposit non-doped oxide layers.

The present invention provides alternatives to the prior art.

SUMMARY OF THE INVENTION

One embodiment of the invention includes a method of making a semiconductor device including providing a semiconductor substrate in a reaction chamber; flowing a first reactant comprising silicon (e.g., TEOS), a boron dopant and a phosphorus dopant into the reaction chamber so that a layer of BPTEOS is deposited on the semiconductor substrate; stopping the flow of the TEOS, boron dopant and phosphorus dopant into the reaction chamber and so that a phosphorus dopant and boron dopant rich film is deposited over the layer of BPTEOS; reducing the phosphorus dopant and boron dopant rich film including exposing the film to an $O_2$ plasma.

Another embodiment of the invention includes a method wherein the phosphorus dopant comprises TEPO.

Another embodiment of the invention includes a method wherein the boron dopant comprises TEB.

In another embodiment of the invention the layer of BPTEOS is deposited as an interlayer dielectric.

In another embodiment of the invention the layer of BPTEOS is deposited on a metallization layer of the semiconductor substrate.

Another embodiment of the invention includes a method including providing a semiconductor substrate in a reaction chamber; flowing TEOS, phosphorus precursor (such as TEPO) and boron precursor (such as TEB) into the reaction chamber and so that a layer of BPTEOS is deposited on a semiconductor substrate; stopping the flow of the TEOS, and precursor (such as TEPO and TEB) into the reaction chamber and so that a phosphorus/boron (such as TEPO/TEB)-rich film is deposited on the layer of BPETOS; reducing the phosphorus/boron (such as TEPO/TEB)-rich film comprising exposing the film to an $O_2$ plasma.

Another embodiment of the invention includes a method including providing a substrate including a phosphorus/boron (such as TEPO/TEB)-rich film and reducing the film comprising exposing the film to an $O_2$ plasma.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
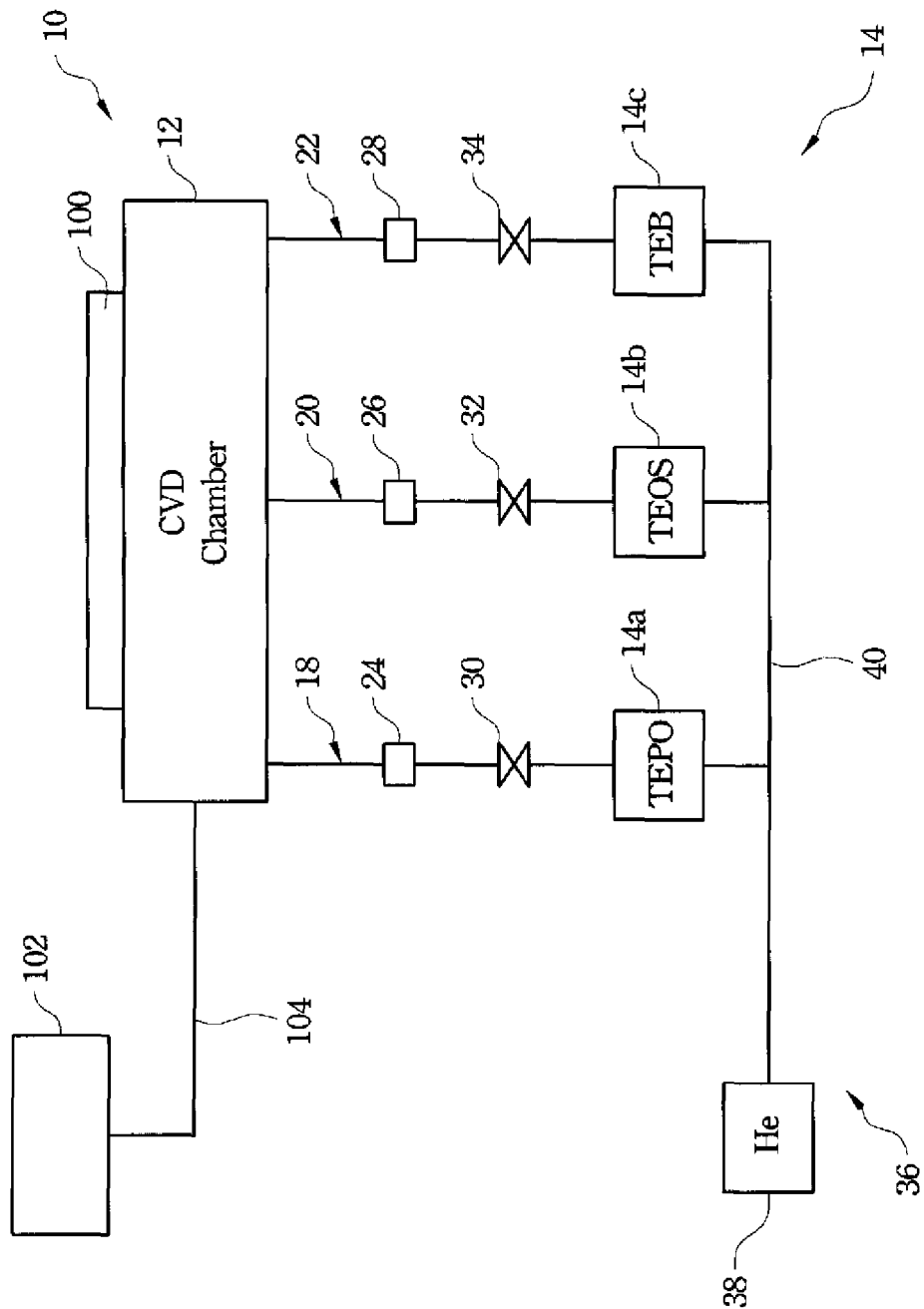
FIG. 1 is a schematic illustration of a chemical vapor deposition reaction chamber including reactant containers plumbed to the chemical vapor deposition chamber including shutoff valves and flow meters useful in one embodiment of a method of the present invention.

Referring now to FIG. 1, a method according to one embodiment of the present invention may utilize a reactor system 10 which includes a chemical vapor deposition chamber 12. A plurality of reactant sources 14 may be provided including a phosphorus dopant vessel 14a constructed and arranged to hold a phosphorus dopant material such as TEPO, a TEOS vessel 14b constructed and arranged to hold a material including silicon such as TEOS, and a boron dopant vessel 14c constructed and arranged to hold a boron dopant material such as TEB. Plumbing lines 18, 20, 22 may be respectively connected to vessels 14a, 14b and 14c. Each of the plumbing lines 18, 20, 22 may include a flow meter 24, 26, 28 respectively, and control valves 30, 32 and 34 respectively. A delivery mechanism 36 may be provided to cause the materials in each of the vessels 14a, 14b and 14c to flow into the chemical vapor deposition chamber 12. In one embodiment, the delivery mechanism 36 includes a helium source 38 and helium plumb lines 40 connected from the helium source 38 to each of the vessels 14a, 14b and 14c. The reactor system 10 may be utilized to react the TEOS, a phosphorus dopant material, and a boron dopant material in the chemical vapor deposition chamber 12.

The reactor system may also include a means for generating a plasma 100, such as a microwave or RF source. An oxygen storage vessel 102 with oxygen therein may be provided along with plumbing 104 for injecting the oxygen into the chamber 12. Other equipment for producing a plasmas such as magnetic coils (not shown) and the like may be provided in a manner known to those skilled in the art.

Figure 2:
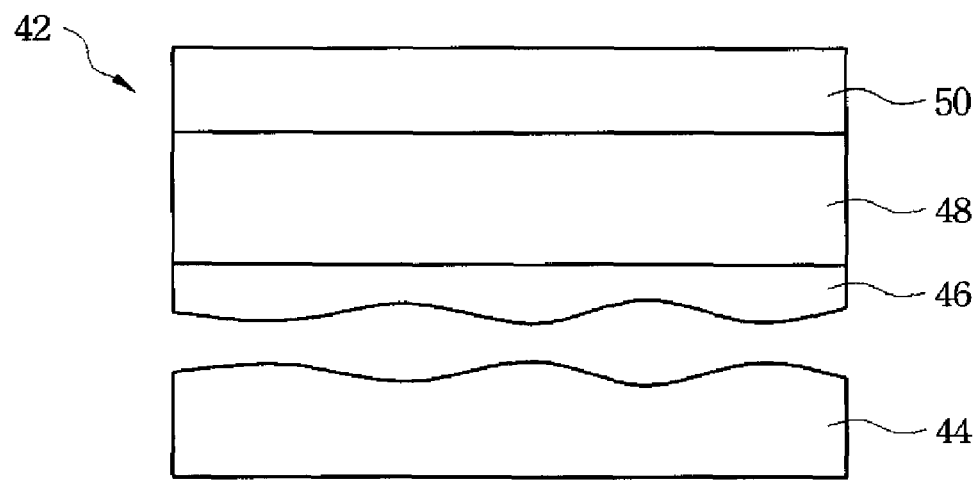
FIG. 2 illustrates a semiconductor device made according to one embodiment of the invention, wherein the semiconductor device includes a BPTEOS layer and a overlying phosphorus dopant and boron dopant rich layer.

Referring now to FIG. 2, a semiconductor device 42 may be formed utilizing a method according to the present invention wherein a semiconductor substrate 44, such as, but not limited to, a silicon substrate is provided in the chemical vapor deposition reaction chamber 12. TEOS, a boron dopant, such as but not limited to, TEB, and a phosphorus dopant, such as, but not limited to, TEPO are flowed into the reaction chamber 12 so that a layer of BPTEOS 48 is deposited over one of a first layer 46 and the semiconductor substrate 44. When a first layer 46 is present, the first layer 46 may be any layer utilized in the manufacture of a semiconductor device, including, but not limited to, a metallization layer or a dielectric layer.

At least one of the boron dopant material and phosphorus dopant material may be in liquid form in the vessels 14a and 14c. After the BPTEOS layer 48 has reached a desired thickness, the valves 30, 32 and 34 can be shut to stop the flow of the reactants to the chemical vapor deposition chamber 12. However, because at least one or both of the boron dopant material and phosphorus dopant material are in liquid form, the dopant materials continued to flow into the chemical vapor deposition chamber 12 and a boron dopant and/or phosphorus dopant-rich film 50 is formed over the BPTEOS layer 48. In one embodiment of the invention, the film 50 is a TEPO/TEB-rich film.

Figure 3:
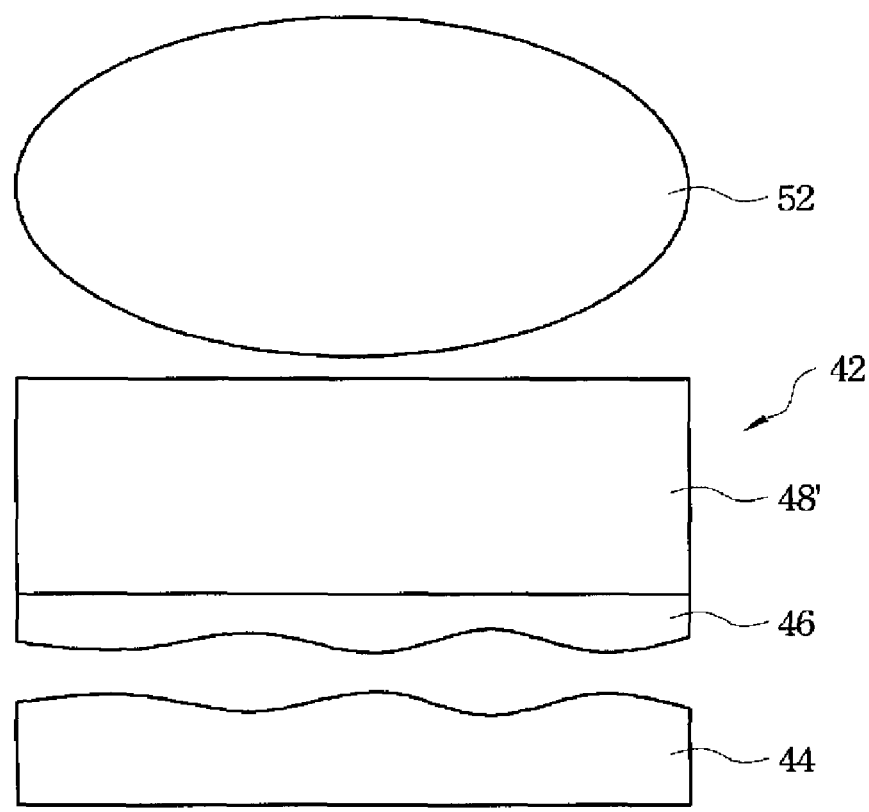
FIG. 3 illustrates a semiconductor device made according to one embodiment of the invention wherein the phosphorus dopant and boron dopant rich layer of FIG. 2 is reduced.

Referring now to FIG. 3, according to one embodiment of the invention, the boron dopant and/or phosphorus dopant rich film 50 is reduced by exposing the film 50 to an $O_2$ plasma 52 to form a BTEOS/$P_2O_5$/$B_2O_3$ layer 48'. For example, where the film 50 includes TEPO, the addition of oxygen reduces the TEPO to $P_2O_5$. Where the film 50 includes TEB, the addition of oxygen reduces the TEB to $B_2O_3$.

The formation of the BPTEOS layer may be accomplished at atmospheric pressure or sub-atmospheric pressure, both with the optional addition of oxygen and/or ozone.

In one embodiment of the invention the dopant concentrations in the boron dopant material may be at least 0.1 weight percent boron. In another embodiment of the invention the dopant concentration of the boron dopant material may range from 0.1 weight percent to about 6 weight percent boron. In one embodiment of the invention the dopant concentration for the phosphorus dopant material includes at least 0.1 weight percent phosphorus. In another embodiment of the invention the dopant concentration for the phosphorus dopant material includes about 0.1 weight percent to 8 weight percent phosphorus.

Alternatively, in one embodiment of the invention, the boron dopant may comprise trimethylborate or SiOB. In another embodiment of the invention the phosphorus dopant comprises trimethylphosphite or TMPO.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method comprising:
providing a semiconductor substrate in a reaction chamber;
flowing a first reactant source comprising silicon into the reaction chamber, flowing a boron dopant source into the reaction chamber and a phosphorus dopant source into the reaction chamber so that a layer of BPTEOS is deposited on the semiconductor substrate having a first dopant level of phosphorus and boron;
stopping the flow of the first reactant source, the boron dopant and the phosphorus dopant into the reaction chamber and so that a phosphorus/boron rich film having a second dopant level of phosphorus and boron higher than said first dopant level is deposited over the layer of BPTEOS wherein the flow of the first reactant source is stopped from flowing into the reaction chamber prior to stopping the flow of the boron dopant and the phosphorus dopant into the reaction chamber; and
reducing the phosphorus/boron rich film.

2. A method as set forth in claim 1 wherein the phosphorus dopant source comprises TEPO (trimethylphosphate).

3. A method as set forth in claim 1 wherein the boron dopant source comprises TEB (trimethylborate).

4. A method as set forth in claim 1 wherein the layer of BPTEOS is deposited as an interlayer dielectric.

5. A method as set forth in claim 1 wherein the layer of BPTEOS is deposited on a metallization layer of the semiconductor substrate.

6. A method as set forth in claim 1 wherein the phosphorus dopant source comprises at least 0.1 weight percent phosphorus.

7. A method as set forth in claim 1 wherein the boron dopant source comprises at least 0.1 weight percent boron.

8. A method as set forth in claim 1 wherein the boron dopant source comprises 0.1 to 6 weight percent boron.

9. A method as set forth in claim 1 wherein the phosphorus dopant source comprises 0.1 to 8 weight percent phosphorus.

10. A method as forth in claim 1 wherein the first reactant source comprises TEOS.

11. A method as set forth in claim 1 wherein the reducing the phosphorous/boron rich film comprises exposing the film to an $O_2$ plasma.

12. A method comprising:
providing a semiconductor substrate in a reaction chamber;
flowing TEOS, TEB and TEPO into the reaction chamber so that a layer of BPTEOS having a first dopant level of phosphorus and boron is deposited on the semiconductor substrate;
stopping the flow of the TEOS, TEB and TEPO into the reaction chamber and so that a TEPO/TEB rich film having a second dopant level of phosphorus and boron higher than said first dopant level is deposited over the layer of BPTEOS wherein the flow of the TEOS is stopped from flowing into the reaction chamber prior to stopping the flow of the TEB and the TEPO into the reaction chamber; and
reducing the TEPO/TEB film.

13. A method as set forth in claim 12 wherein the reducing the film comprises exposing the film to an $O_2$ plasma.

14. A method as set forth in claim 13 wherein the TEPO comprises at least 0.1 weight percent phosphorus.

15. A method as set forth in claim 13 wherein the TEB comprises at least 0.1 weight percent boron.

16. A method comprising:
providing a substrate having a TEPO/TEB rich film and reducing the TEPO/TEB rich film through an $O_2$ plasma; wherein the TEPO/TEB rich film is formed by stopping a flow of a first reactant source comprising an underlying layer from flowing into the reaction chamber prior to stopping the flow of the TEPO and the TEB into the reaction chamber.

17. A method as set forth in claim 16 wherein the TEPO/TEB rich film is formed on a BPTEOS layer.

18. A method as set forth in claim 17 wherein the BPTEOS layer is formed on a dielectric layer, metallization layer, or a silicon substrate.

* * * * *